(12) United States Patent
Chisaka

(10) Patent No.: US 8,389,866 B2
(45) Date of Patent: *Mar. 5, 2013

(54) RESIN CIRCUIT BOARD

(75) Inventor: Shunsuke Chisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/227,523

(22) Filed: Sep. 8, 2011

(65) Prior Publication Data

US 2012/0000695 A1    Jan. 5, 2012

Related U.S. Application Data

(63) Continuation of application No. PCT/JP2010/053117, filed on Feb. 26, 2010.

(30) Foreign Application Priority Data

Mar. 9, 2009  (JP) ................................ 2009-054874

(51) Int. Cl.
  *H05K 1/09* (2006.01)
(52) U.S. Cl. ....................................... 174/257; 174/261
(58) Field of Classification Search .................. 174/257, 174/261, 262, 265, 255; 361/795, 749, 751; 428/209, 901; 257/74
See application file for complete search history.

(56) References Cited

U.S. PATENT DOCUMENTS

| 6,258,449 | B1 * | 7/2001 | Nagasawa et al. | 428/209 |
| 6,296,949 | B1 * | 10/2001 | Bergstresser et al. | 428/626 |
| 6,329,074 | B1 | 12/2001 | Fujiwara et al. | |
| 7,095,623 | B2 * | 8/2006 | Suwa et al. | 361/795 |
| 2003/0133275 | A1 | 7/2003 | Miyake et al. | |
| 2003/0218871 | A1 | 11/2003 | Suwa et al. | |
| 2012/0003499 | A1 * | 1/2012 | Chisaka | 428/622 |

FOREIGN PATENT DOCUMENTS

| JP | 2000-165037 A | 6/2000 |
| JP | 2003-332749 A | 11/2003 |
| JP | 2003-347742 A | 12/2003 |

OTHER PUBLICATIONS

Official Communication issued in International Patent Application No. PCT/JP2010/053117, mailed on Apr. 13, 2010.
Chisaka, "Flexible Board", U.S. Appl. No. 13/227,525, filed Sep. 8, 2011.
Official Communication issued in corresponding Japanese Patent Application No. 2011-503766, mailed on Oct. 3, 2012.

* cited by examiner

*Primary Examiner* — Yuriy Semenenko
(74) *Attorney, Agent, or Firm* — Keating & Bennett, LLP

(57) ABSTRACT

A resin circuit board includes a layered structure of resin layers and conductor layers, has significantly reduced and minimized warping and distortion, and has a precise shape. A second conductor layer is disposed between a resin layer and a first conductor layer made of a metal. The resin layer and the second conductor layer have a higher thermal expansion coefficient than the first conductor layer such that the thermal expansion coefficient changes gradually, allowing a stress resulting from a difference in thermal expansion coefficient to be relieved.

8 Claims, 4 Drawing Sheets

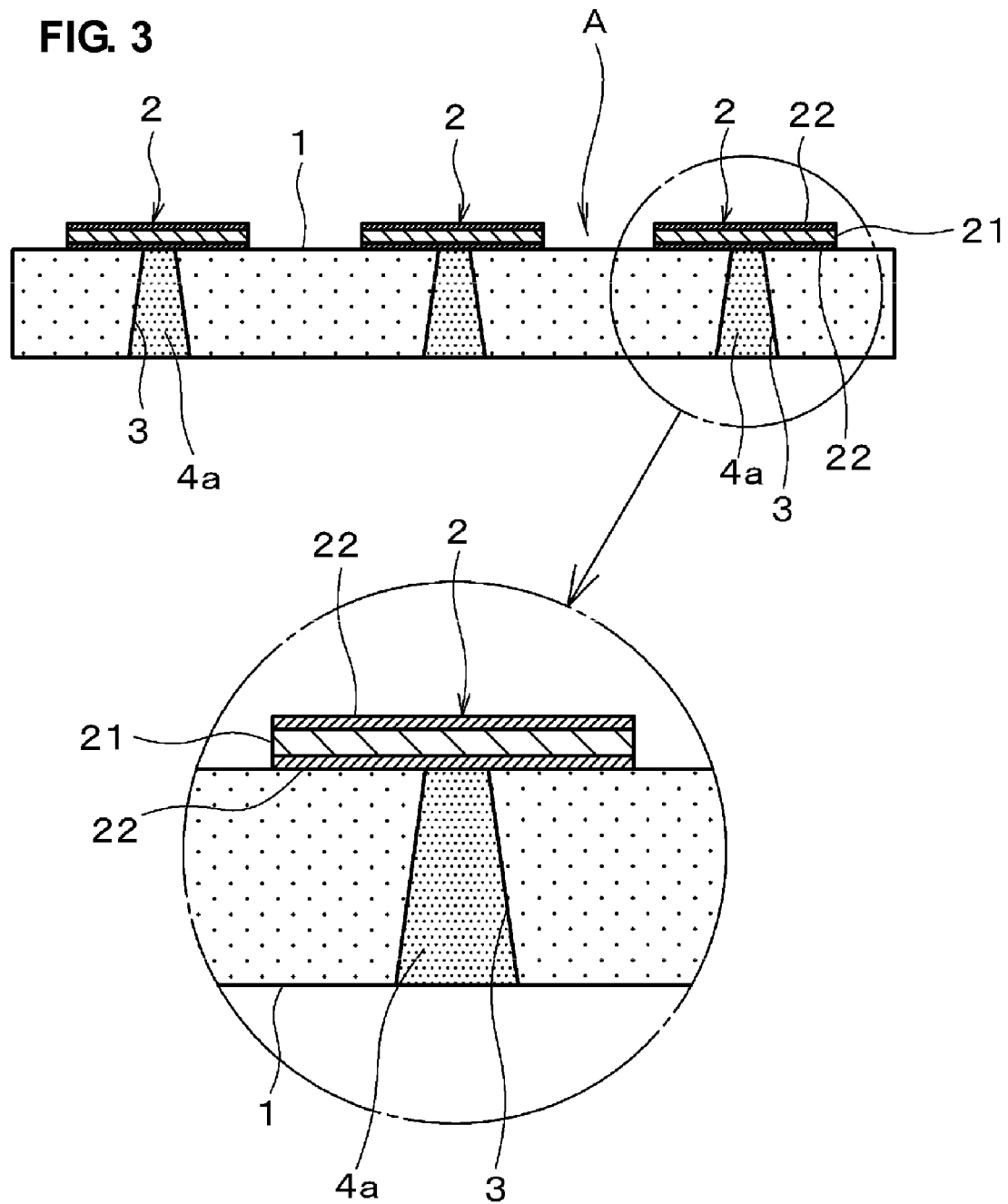

RESIN CIRCUIT BOARD

BACKGROUND OF THE INVENTION

1. Field of the Invention

The present invention relates to a resin circuit board and, more particularly, to a resin circuit board including conductor patterns separated by a thermoplastic resin layer and connected to each other with an interlayer-connecting conductor.

2. Description of the Related Art

In recent years, multilayer circuit boards including three-dimensional wiring conductors have been widely used in various applications. Although ceramic multilayer circuit boards having a layered structure of ceramic layers and conductor patterns have been frequently used, resin circuit boards having a layered structure of resin layers and conductor patterns also have recently been used.

In resin circuit boards including an insulating resin layer, the resin layer is formed of a thermoplastic resin having a melting point of 250° C. or more, such as a liquid crystal polymer (LCP) or polyetheretherketone (PEEK).

In general, conductor patterns are patterned conductor foils, such as Cu foil.

One proposed resin circuit board containing a thermoplastic resin includes, as thermoplastic resin layers, thermoplastic resin films composed of 65% to 35% by weight of polyetheretherketone resin and 35% to 65% by weight of polyetherimide resin and, as conductor layers (conductor patterns), Cu foil (Japanese Unexamined Patent Application Publication No. 2003-332749).

In this resin circuit board, the thermoplastic resin layers and the conductor layers are different in terms of thermal expansion coefficient. A difference in thermal expansion coefficient can cause a problem, such as warping or distortion, in the resin circuit board. Warping or distortion may result in products that do not meet a standard, unstable mounting of electronic components, and other defects.

SUMMARY OF THE INVENTION

In view of the problems described above, preferred embodiments of the present invention provide a resin circuit board that includes a layered structure of resin layers and conductor layers, has significantly reduced and minimized warping or distortion, and has a precise shape.

A resin circuit board according to a preferred embodiment of the present invention includes resin layers and conductor layers alternately stacked on top of one another, wherein each of the conductor layers includes a first conductor layer made of a first metal and a second conductor layer made of a second metal disposed between one of the resin layers and the first conductor layer, the second metal having a higher thermal expansion coefficient than the first metal.

It is desirable that the second conductor layer be in contact with the corresponding resin layer.

It is desirable that the second conductor layer be in contact with the first conductor layer.

It is also desirable that the second conductor layer be disposed over an entire interface between the corresponding conductor layer and the corresponding resin layer.

It is further desirable that (a) the second conductor layer be made of an alloy of the first metal of the first conductor layer, or (b) an alloy layer be disposed between the first conductor layer and the second conductor layer, the alloy layer being made of an alloy of the first metal of the first conductor layer and the second metal of the second conductor layer.

It is desirable that the alloy be formed during a process of stacking the conductor layers and the resin layers.

It is preferable that the resin layers are formed of a thermoplastic resin, for example.

It is desirable that the second conductor layer have a lower thermal expansion coefficient than the resin layers.

It is desirable that the first metal of the first conductor layer be mainly composed of Cu.

In a resin circuit board according to a preferred embodiment of the present invention, a second conductor layer is disposed between a resin layer and a first conductor layer. The resin layer generally has a higher thermal expansion coefficient than the first conductor layer made of a metal. The second conductor layer has a higher thermal expansion coefficient than the first conductor layer. Thus, the second conductor layer having an intermediate thermal expansion coefficient between the thermal expansion coefficient of the resin layer and the thermal expansion coefficient of the first conductor layer is disposed between the resin layer and the first conductor layer. The resulting graded thermal expansion coefficients can relieve a stress caused by a difference in thermal expansion coefficient between the thermosetting resin layer and the conductor layer. Thus, a resin circuit board with less warping or distortion can be obtained.

The second conductor layer in contact with the resin layer can efficiently relieve a stress caused by a difference in thermal expansion coefficient between the thermosetting resin layer and the conductor layer.

The second conductor layer in contact with the first conductor layer can also efficiently relieve a stress caused by a difference in thermal expansion coefficient. Thus, a resin circuit board with significantly reduced and minimized warping or distortion is provided.

The second conductor layer disposed over the entire interface between the conductor layer and the resin layer can further efficiently relieve a stress caused by a difference in thermal expansion coefficient.

In the case that (a) the second conductor layer is made of an alloy of the first metal of the first conductor layer or (b) an alloy layer made of an alloy of the first metal of the first conductor layer and the second metal of the second conductor layer is disposed between the first conductor layer and the second conductor layer, the resulting graded thermal expansion coefficients from the second conductor layer to the first conductor layer can further efficiently relieve a stress caused by a difference in thermal expansion coefficient.

The alloy can be formed under controlled pressure, temperature, and other conditions in a process of stacking and pressing conductor layers and resin layers.

This obviates the necessity of an additional process for alloying the first metal and second metal, thus maintaining high productivity.

In the case that the second metal of the second conductor layer is a low-melting-point metal melting in the stacking and pressing process, the second conductor layer formed after the stacking and pressing process is highly likely to be an alloy layer containing the first metal of the first conductor layer.

In the case that the second metal of the second conductor layer is a high-melting-point metal not melting in the stacking and pressing process, an alloy layer of the first metal of the first conductor layer and the second metal of the second conductor layer (that is, a diffusion layer due to solid phase diffusion) is highly likely to be formed between the first conductor layer and the second conductor layer after the stacking and pressing process.

Use of a thermoplastic resin in the resin layers under appropriately controlled conditions (such as temperature and pressing pressure) in the stacking process allows each layer to be efficiently stacked and the conductor layer and a via-hole conductor to be electrically connected. Thus, a resin circuit board with significantly less warping or distortion can be efficiently manufactured.

The resin layers generally have a higher thermal expansion coefficient than the metal layers. While the second conductor layer generally has a lower thermal expansion coefficient than the resin layer, the thermal expansion coefficient of the second conductor layer is intentionally lowered relative to the thermal expansion coefficient of the resin layer in various preferred embodiments of the present invention, ensuring that the thermal expansion coefficient decreases in the order of the resin layer, the second conductor layer, and the first conductor layer (that is, the thermal expansion coefficient alters in a stepwise or graded manner). This can relieve a stress caused by a difference in thermal expansion coefficient and significantly reduce and minimize the occurrence of warping or distortion.

It is desirable to use Cu in the first conductor layer in terms of electrical characteristics. A single conductor layer mainly composed of Cu may be warped or distorted because of a difference in thermal expansion coefficient between the conductor layer and the resin layer. However, the second conductor layer having a higher thermal expansion coefficient than the first conductor layer made of Cu in a preferred embodiment of the present invention can relieve the stress, providing a resin circuit board with less warping or distortion.

When the first conductor layer is mainly composed of Cu, examples of the second metal of the second conductor layer having a higher thermal expansion coefficient than the first conductor layer include Cr, Zn, Al, Sn, and Ni. These metals can relieve stress, providing a resin circuit board with less warping or distortion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a schematic explanatory view of a method for manufacturing the resin circuit board illustrated in FIGS. 1A and 1B, illustrating a process following the process illustrated in FIG. 2C.

DETAILED DESCRIPTION OF THE PREFERRED EMBODIMENTS

Figure 1A:
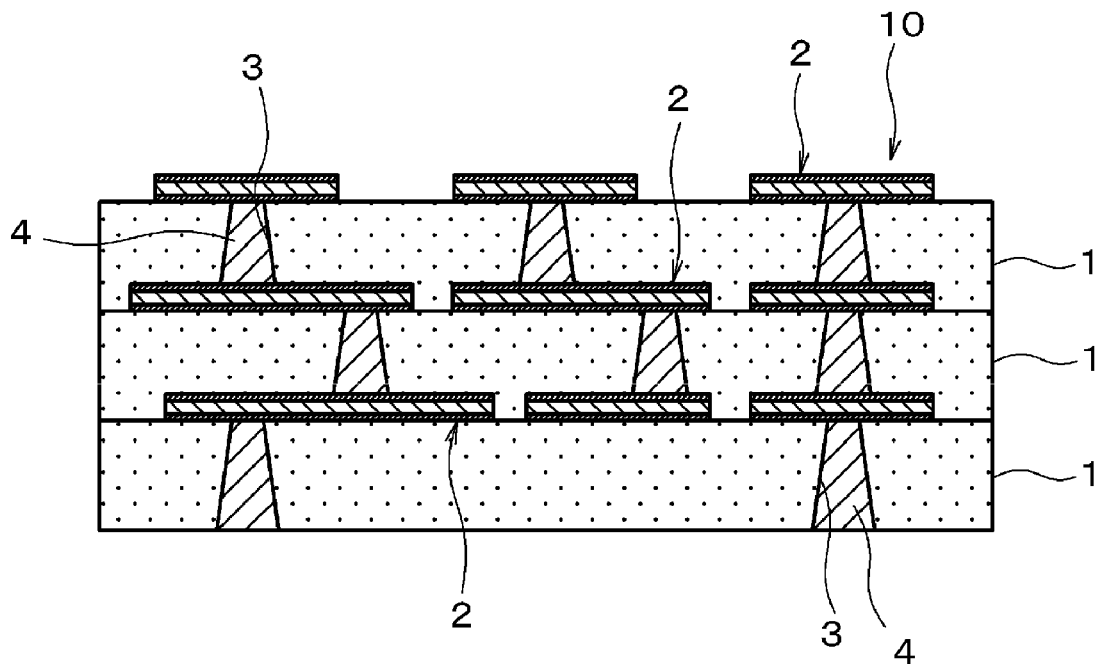
FIG. 1A is a schematic view of a resin circuit board according to one preferred embodiment of the present invention.
Figure 1B:
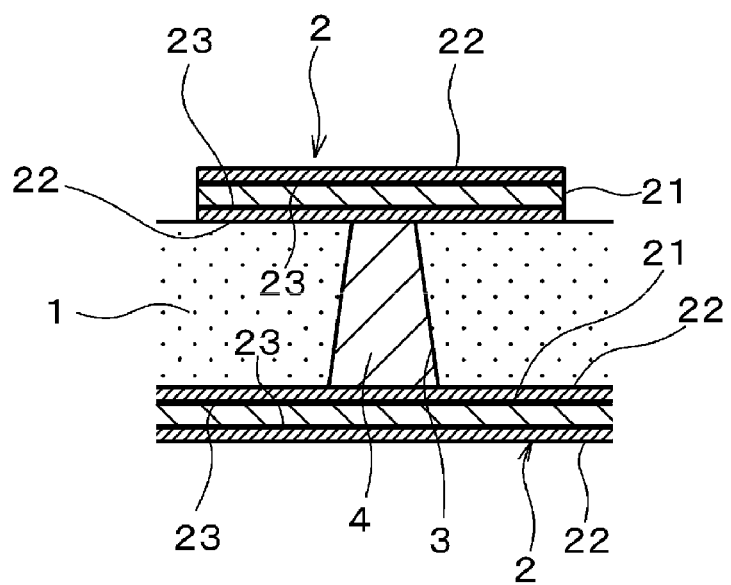
FIG. 1B is an enlarged view of a principal portion thereof.

The present invention will be further described in the following preferred embodiments.
First Preferred Embodiment
FIGS. 1A and 1B schematically illustrate a resin circuit board having a multilayer structure according to one preferred embodiment of the present invention. FIG. 1A is a front cross-sectional view, and FIG. 1B is an enlarged cross-sectional view of a principal portion thereof.

As illustrated in FIGS. 1A and 1B, a resin circuit board (multilayer resin circuit board) 10 includes a resin layer (a thermoplastic resin layer in the present preferred embodiment) 1, a conductor layer (conductor pattern) 2 having a predetermined pattern disposed on the thermoplastic resin layer 1, and a via-hole conductor 4 in a through-hole 3 disposed in the thermoplastic resin layer 1. The via-hole conductor 4 connects the conductor layers 2. The resin layer 1, the conductor layer 2, and the via-hole conductor 4 constitute a substrate layer A (see FIGS. 2C, 3, and 4).

In the multilayer resin circuit board 10, the thermoplastic resin layer 1 is preferably formed of a thermoplastic resin having a melting point of about 250° C. or more, for example, such as a liquid crystal polymer (LCP) or polyetheretherketone (PEEK), for example.

In the present preferred embodiment, the thermoplastic resin preferably has a thermal expansion coefficient (the coefficient of linear expansion) of approximately 18 (in the in-plane direction) and approximately 60 (in the thickness direction) ($10^{-6}$/° C.).

The resin of the resin layer 1 is not necessarily a thermoplastic resin and may be a thermosetting resin, for example.

The conductor layer 2 includes a first conductor layer 21 and second conductor layers 22. The first conductor layer 21 is preferably made of Cu, which is a first metal according to a preferred embodiment of the present invention. The second conductor layers 22 are disposed over the entire surfaces on the front and back sides of the first conductor layer 21. The second conductor layers 22 are preferably made of Al (a second metal according to a preferred embodiment of the present invention), which has a higher thermal expansion coefficient than Cu of the first conductor layer 21. The conductor layer 2 is disposed on the resin layer 1 such that each of the second conductor layers 22 is in contact with the corresponding resin layer 1.

The thermal expansion coefficients (the coefficients of linear expansion) of Cu and Al preferably are, for example, approximately 16 ($10^{-6}$/° C.) and approximately 23 ($10^{-6}$/° C.), respectively.

The multilayer resin circuit board 10 further includes an alloy layer (solid phase diffusion layer) 23 between the first conductor layer 21 and each of the second conductor layers 22 (see FIG. 1B). The alloy layers 23 are preferably composed of Cu of the first conductor layer 21 and Al of the second conductor layers 22. The alloy layers 23 preferably have a thermal expansion coefficient higher than the thermal expansion coefficient of the first conductor layer 21 and lower than the thermal expansion coefficient of the second conductor layers 22.

The via-hole conductor 4 is preferably formed by solidifying an electroconductive paste mainly composed of Ag in the through-hole 3.

As described above, the multilayer resin circuit board 10 includes the thermoplastic resin layers 1 and the conductor layers 2 alternately stacked on top of one another. Each of the conductor layers 2 includes the first conductor layer 21 made of the first metal Cu and the second conductor layers 22 made of the second metal Al having a higher thermal expansion coefficient than Cu of the first conductor layer 21. The multilayer resin circuit board 10 further includes the alloy layers (solid phase diffusion layers) 23 of Cu of the first conductor layer 21 and Al of the second conductor layers 22 between the first conductor layer 21 and the second conductor layers 22 (see FIG. 1B).

Thus, the multilayer resin circuit board 10 includes the second conductor layers 22 between the first conductor layer 21 and the resin layers 1 having a higher thermal expansion coefficient than Cu of the first conductor layer 21, and the alloy layers (solid phase diffusion layers) 23 (see FIG. 1B) between the first conductor layer 21 and the second conductor layers 22. The second conductor layers 22 preferably have an intermediate thermal expansion coefficient between the thermal expansion coefficient of the first conductor layer 21 and the thermal expansion coefficient of the resin layer 1. The alloy layers 23 have an intermediate thermal expansion coefficient between the thermal expansion coefficient of the first conductor layer 21 and the thermal expansion coefficient of the second conductor layers 22.

These interlayers effectively relieve a stress caused by a difference in thermal expansion coefficient between the thermoplastic resin layer 1 and the conductor layer 2, and significantly reduce and minimize warping or distortion of the multilayer resin circuit board 10.

An example of a method for manufacturing the multilayer resin circuit board 10 according to a preferred embodiment of the present invention will be described below.

Figure 2A:
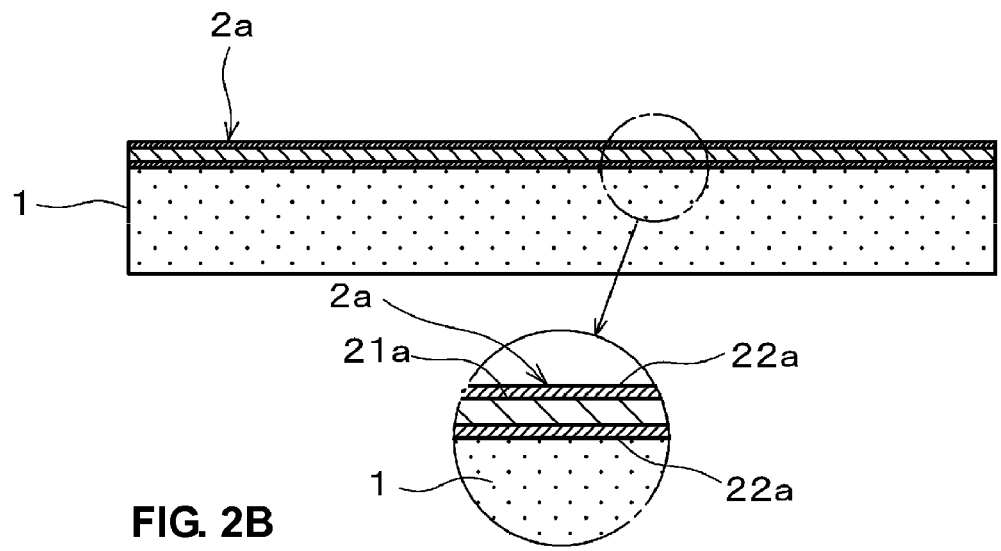
FIGS. 2A, 2B, and 2C are schematic explanatory views of a method for manufacturing the resin circuit board illustrated in FIGS. 1A and 1B.

As illustrated in FIG. 2A, a conductor layer (metallic foil) 2a is attached to a thermoplastic resin layer 1 before patterning. The thermoplastic resin layer 1 is an insulating layer made of a thermoplastic resin preferably having a melting point of about 250° C. or more, such as liquid crystal polymer (LCP) or polyetheretherketone (PEEK), for example. The conductor layer 2a includes Cu foil 21a (a metal layer for a first conductor layer 21) and covering layers 22a (metal layers for second conductor layers 22) plated over the entire surface on the front and back sides of the Cu foil 21a. The covering layers 22a are preferably made of Al, which has a higher thermal expansion coefficient than Cu.

The metal layers 22a for the second conductor layers may also be formed by a thin film forming method other than plating, such as sputtering.

Figure 2B:
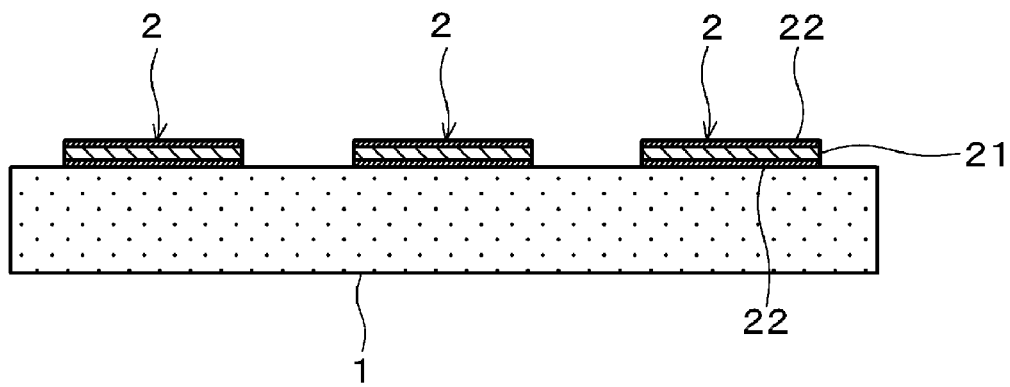

As illustrated in FIG. 2B, the metallic foil 2a on the thermoplastic resin layer 1 is etched to form a conductor layer (conductor pattern) 2 having a desired pattern.

For example, the conductor layer (conductor pattern) 2 can be formed by forming a predetermined resist pattern on the metallic foil 2a, etching the metallic foil 2a with an etchant, and removing the resist pattern.

Alternatively, a patterned metallic foil may be attached to the thermoplastic resin layer 1.

Figure 2C:
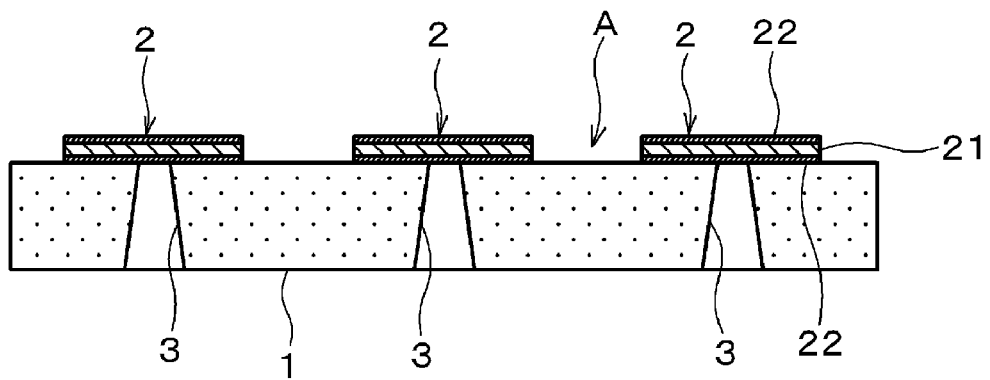

As illustrated in FIG. 2C, a through-hole 3 is formed at a predetermined position in the thermoplastic resin layer 1 by laser processing. A surface of the thermoplastic resin layer 1 on which no conductor layer (conductor pattern) 2 is disposed is irradiated with a laser beam to form the through-hole 3 reaching the back side of the conductor layer (conductor pattern) 2. In the resulting substrate layer A, the patterned conductor layer (conductor pattern) 2 is formed on the thermoplastic resin layer 1 having the through-hole 3 such that a portion of the patterned conductor layer (conductor pattern) 2 covers the through-hole 3.

The procedures for forming the substrate layer A illustrated in FIG. 2C are not limited to those described above. For example, after the through-hole 3 has been formed in the thermoplastic resin layer 1, the conductor layer 2 having the desired pattern may be formed by etching or another process.

As illustrated in FIG. 3, the through-hole 3 in the thermoplastic resin layer 1 (substrate layer A) is filled with an electroconductive paste 4a mainly composed of Ag grains.

Figure 4:
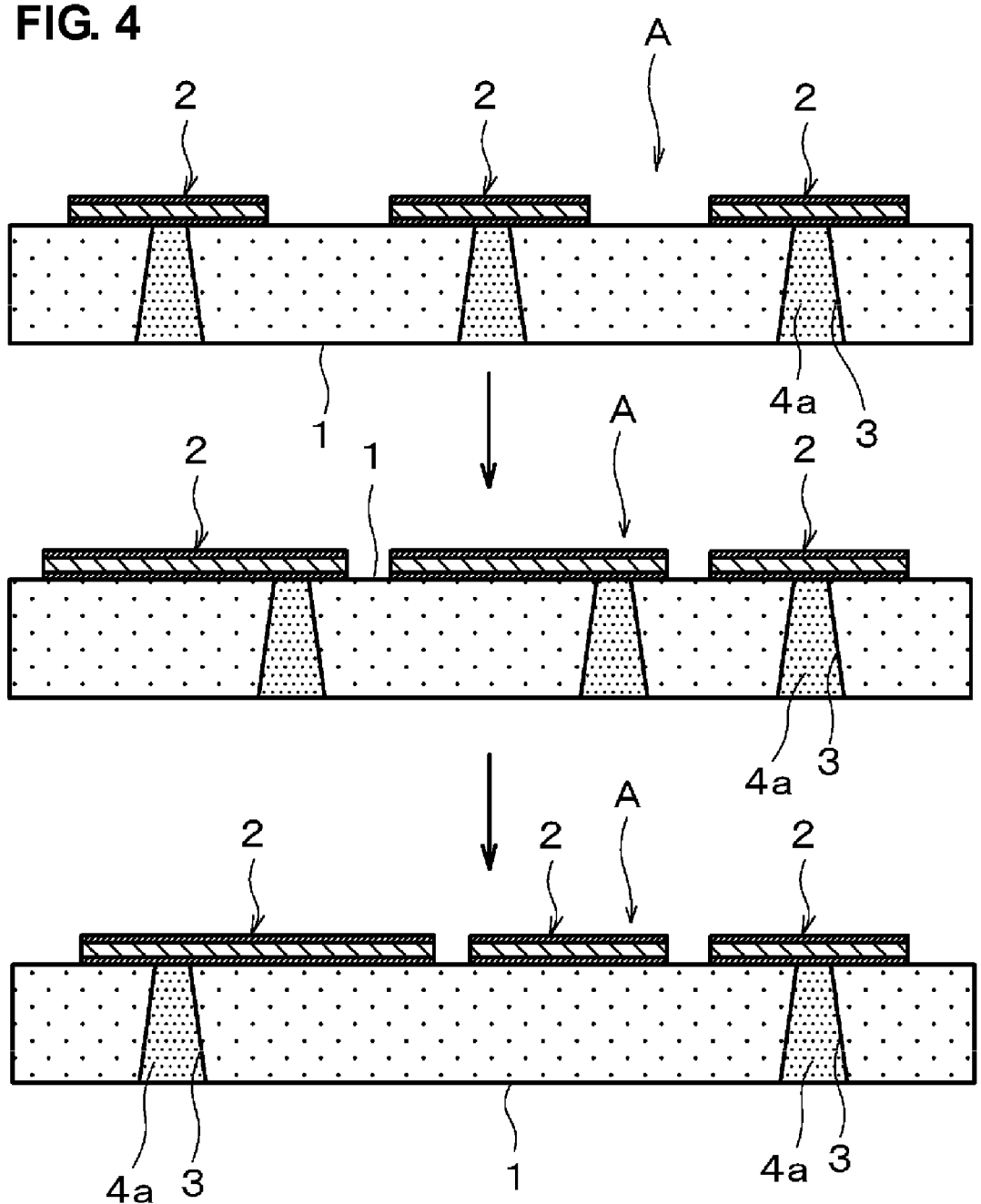
FIG. 4 is a schematic explanatory view of a method for manufacturing the resin circuit board illustrated in FIGS. 1A and 1B, illustrating a process following the process illustrated in FIG. 3.

As illustrated in FIG. 4, the thermoplastic resin layers 1 (substrate layers A) are stacked in a predetermined order and are pressed under vacuum at a temperature that is lower than the melting point of the metal grains (Ag grains) in the electroconductive paste and at which the thermoplastic resin layers 1 exhibit plasticity but do not melt (for example, about 250° C. to about 350° C.). At this temperature in the range of about 250° C. to about 350° C., the first conductor layer (Cu layer) 21 and the second conductor layers (Al layers) 22 of the conductor layer 2 do not melt.

In FIG. 4, the top layer is the thermoplastic resin layer (substrate layer) A illustrated in FIG. 3. The second and third substrate layers from the top are thermoplastic resin layers (substrate layers) A in which the shape of the conductor layer (conductor pattern) 2 and the positions of the through-holes 3 are different from those of the top layer.

Through the stacking and pressing process, the thermoplastic resin layers 1 are pressed (laminated) into one piece, and the via-hole conductors 4 are connected to the conductor layers (conductor patterns) 2.

Through the stacking and pressing process, alloy layers (solid phase diffusion layers) 23 are also formed between the first conductor layer 21 and the second conductor layers 22 (see FIG. 1B). The alloy layers are composed of Cu of the first conductor layer 21 and Al of the second conductor layers 22.

Thus, the thermal expansion coefficient alters gradually from the thermoplastic resin layer 1 to the first conductor layer 21 through the second conductor layer 22 and the alloy layer 23, allowing a stress caused by a difference in thermal expansion coefficient to be efficiently relieved.

This can relieve a stress caused by a difference in thermal expansion coefficient between the thermoplastic resin layer 1 and the conductor layer 2, allowing efficient manufacture of the multilayer resin circuit board 10 with less warping or distortion.

In the present preferred embodiment, the metal layer 21a for the first conductor layer is a Cu layer (Cu foil), and the metal layers 22a for the second conductor layers are Al layers. Alternatively, the metal layer 21a for the first conductor layer may be made of a conductive material other than Cu. The metal layers 22a for the second conductor layers may also be made of another metallic material, for example, Cr, Zn, Sn, or Ni provided that the metallic material has a higher thermal expansion coefficient than the metal of the first conductor layer.

In the multilayer resin circuit board 10 described above, since the first conductor layer (Cu foil) 21 is covered with the second conductor layers (Al layers) 22, the first conductor layer (conductor pattern) can be protected from oxidation. This obviates the necessity of a plating process for preventing the oxidation after the stacking process.

In the present preferred embodiment, the second metal of the second conductor layers preferably is a high-melting-point metal (Al) that does not melt in the stacking and pressing process, and after the stacking and pressing process, alloy layers of the first metal of the first conductor layer and the second metal of the second conductor layers (that is, diffusion layers resulting from solid phase diffusion) are formed between the first conductor layer and the second conductor layers. However, in the case that the second metal is a low-melting-point metal (for example, Sn) that melts in the stacking and pressing process, the second conductor layers formed after the stacking and pressing process are alloy layers containing the first metal of the first conductor layer.

Also in other respects, the present invention is not limited to the preferred embodiments described above. For example, the type of the resin material of the resin layer, the specific pattern of the conductor layer (conductor pattern), and the numbers of resin layers and conductor layers alternately stacked on top of one another and their stacked form may be modified or altered without departing from the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin circuit board, comprising:
resin layers and conductor layers alternately stacked on top of one another; wherein each of the conductor layers includes:
a first conductor layer made of a first metal;
a second conductor layer made of a second metal disposed between one of the resin layers and the first conductor layer, the second metal having a higher thermal expansion coefficient than the first metal; and
a solid diffusion layer disposed between the first conductor layer and the second conductor layer, the solid diffusion layer having a thermal expansion coefficient that is greater than the thermal expansion coefficient of the first metal and less than the thermal expansion coefficient of the second metal.

2. The resin circuit board according to claim 1, wherein the second conductor layer is in contact with a corresponding one of the resin layers.

3. The resin circuit board according to claim 1, wherein the second conductor layer is in contact with the first conductor layer.

4. The resin circuit board according to claim 1, wherein the second conductor layer is disposed over an entire interface between a corresponding one of the conductor layers and a corresponding one of the resin layers.

5. The resin circuit board according to claim 1, wherein the solid diffusion layer is formed during a process of stacking the conductor layers and the resin layers.

6. The resin circuit board according to claim 1, wherein the resin layers are made of a thermoplastic resin.

7. The resin circuit board according to claim 1, wherein the second conductor layer has a lower thermal expansion coefficient than that of the resin layers.

8. The resin circuit board according to claim 1, wherein the first metal of the first conductor layer is mainly composed of Cu.

* * * * *